United States Patent
Lin et al.

(10) Patent No.: US 8,440,158 B2
(45) Date of Patent: May 14, 2013

(54) PRE-PLATING SOLUTIONS FOR MAKING PRINTED CIRCUIT BOARDS AND METHODS FOR PREPARING THE SAME

(75) Inventors: Cheng-Hsien Lin, Taipei Hsien (TW); Yao-Wen Bai, Shenzhen (CN); Rui Zhang, Shenzhen (CN); Wen-Chin Lee, Taipei Hsien (TW)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 846 days.

(21) Appl. No.: 12/195,844

(22) Filed: Aug. 21, 2008

(65) Prior Publication Data

US 2009/0078578 A1 Mar. 26, 2009

(30) Foreign Application Priority Data

Sep. 21, 2007 (CN) .......................... 2007 1 0077348

(51) Int. Cl.
*D01F 9/12* (2006.01)
*H01B 1/04* (2006.01)
*H05K 3/00* (2006.01)

(52) U.S. Cl.
USPC ......... 423/447.1; 252/502; 205/125; 977/742

(58) Field of Classification Search .... 423/447.1–447.3; 205/125; 252/502; 977/742
See application file for complete search history.

(56) References Cited

U.S. PATENT DOCUMENTS

| | | | |
|---|---|---|---|
| 6,908,572 B1 * | 6/2005 | Derbyshire et al. | .......... 252/502 |
| 7,125,533 B2 * | 10/2006 | Khabashesku et al. | .... 423/447.1 |
| 2003/0116503 A1 * | 6/2003 | Wang et al. | .................. 210/660 |
| 2004/0101467 A1 * | 5/2004 | Harutyunyan et al. | .... 423/447.3 |
| 2006/0052509 A1 * | 3/2006 | Saitoh | ............................ 524/496 |
| 2006/0057290 A1 * | 3/2006 | Glatkowski | .................... 427/256 |
| 2006/0204427 A1 * | 9/2006 | Ghenciu et al. | ........... 423/445 B |

FOREIGN PATENT DOCUMENTS

| | | |
|---|---|---|
| CN | 1544322 | 11/2004 |
| CN | 1733980 | 2/2006 |

OTHER PUBLICATIONS

Liu, et al., Fullerene Pipes, Science 1998; 280: 1253-1256.*
Zhang, et al., Effect of Chemical Oxidation on the Structure of Single-Walled Carbon Nanotubes, J. Phys. Chem. B. 2003; 107: 3712-3718.*
Ren, et al., Synthesis of Large Arrays of Well-Aligned Carbon Nanotubes on Glass, Science 1998; 282: 1105-1107.*
Hsiang-Chen Wei, "Studies on the Conduction Polymers and Multi-Wall Carbon Nanotube Nanocomposite Materials", Department of Chemical and Materials Engineering, National Central University, 2007, 01, Lines 4-5 of p. 67,Lines 1-12 of p. 68,Lines 3-6 of p. 71,Line 8 of p. 72 to Line 1 of p. 73,Line 8 of p. 73 to Line 2 of p. 74 and Figure 4-1-3 may be relevant.

* cited by examiner

*Primary Examiner* — Daniel C McCracken
(74) *Attorney, Agent, or Firm* — Altis Law Group, Inc.

(57) ABSTRACT

A pre-plating solution for making a printed circuit board includes carbon nanotubes of 0.01-3 wt %, a surfactant of 0.01-4 wt %, an alkaline substance of 0.01-1 wt % and a solvent. A method for preparing a pre-plating solution comprising the steps of: providing a plurality of carbon nanotubes; purifying the carbon nanotubes; treating the purified carbon nanotubes with an acid; mixing the treated carbon nanotubes, an alkaline substance and a solvent to form suspension; and adding surfactant into suspension.

11 Claims, 2 Drawing Sheets

PRE-PLATING SOLUTIONS FOR MAKING PRINTED CIRCUIT BOARDS AND METHODS FOR PREPARING THE SAME

TECHNICAL FIELD

The present invention relates to a pre-plating solution for making a printed circuit board, and a method for preparing the pre-plating solution.

BACKGROUND

A printed circuit board (PCB) includes a base material and two copper layer formed on a first surface and a second surface opposite thereto, respectively. A number of through-holes are defined in the PCB, which enabling electronic components to be fixed to the PCB. Therefore, the through-holes are needed to establish electrically conductive connections, to make the electronic components interconnected with one another. A through-plating process serves to establish electrically conductive connection from the first surface to the second surface by plating the through-holes.

A conventional pre-plating solution for the through-plating process includes carbon black materials. The carbon black materials are deposited on inner surfaces of the through-holes and form conductive layers thereon. Thereafter, a through-plating process is performed to form metal layers on the conductive layers, and thus the electrically conductive connections are formed. However, due to the large size and bad conductive property thereof, the more quantity of carbon black materials are needed for forming the continuous conductive layers on inner surfaces of the through-holes. As a result, the through-holes have narrower channels left after plating.

With the development of the electronics industry, the more electronic components need be arranged on the PCB, and the narrower and deeper through-holes need be formed in the PCB.

What is needed is a pre-plating solution with some particles having high conductive property and small size, and a method for making the pre-plating solution.

SUMMARY

A pre-plating solution for making a printed circuit board includes carbon nanotubes of 0.01-3 wt %, a surfactant of 0.01-4 wt %, an alkaline substance of 0.01-1 wt % and a solvent. A method for preparing a pre-plating solution comprising the steps of: providing a plurality of carbon nanotubes; purifying the carbon nanotubes; treating the purified carbon nanotubes with an acid; mixing the treated carbon nanotubes, an alkaline substance and a solvent to form suspension; and adding surfactant into suspension.

Other advantages and novel features will become more apparent from the following detailed description when taken in conjunction with the accompanying drawings.

BRIEF DESCRIPTION OF THE DRAWINGS

The components shown are not necessarily to scale, the emphasis instead being placed upon clearly illustrating the principles of the present method. Moreover, like reference numerals designate corresponding parts throughout the several views.

The exemplifications set out herein illustrate at least one preferred embodiment of the invention, in one form, and such exemplifications are not to be construed as limiting the scope of the invention in any manner.

DETAILED DESCRIPTION OF EXEMPLARY EMBODIMENTS

A pre-plating solution for making a printed circuit board (PCB). The pre-plating solution includes carbon nanotubs (CNTs) of 0.01-3 wt %, a surfactant of 0.01-4 wt %, an alkaline substance of 0.01-1 wt % and a solvent. CNTs have an aspect ratio of more than 1000:1 and functional groups formed on the walls and end portions thereof. The functional groups can be any hydrophilic group, such as —COOH, —COO and —OH, and make CNTs soluble in the solvent. The surfactant is selected from a group comprising of anionic surfactants, such as sodium lauryl sulfate, and nonionic surfactants, such as isosorbide dinitrate. The surfactant can help CNTs uniformly dispersed in the solution. The alkaline substance is selected from a group comprising of sodium hydroxide (NaOH), potassium hydroxide (KOH), ammonium hydroxide ($NH_4OH$) and potassium carbonate ($K_2CO_3$). The alkaline substance is used to adjust PH value of the solution to exemplarily 8-10. The solvent is a liquid dispersing medium, e.g., de-ionized water. The pre-plating solution may further include an addition agent to achieve a desired viscosity thereof. The addition agent is material selected from a group comprising of silica gel, polyvinyl alcohol and polyvinyl pyrrolidone.

Figure 1:
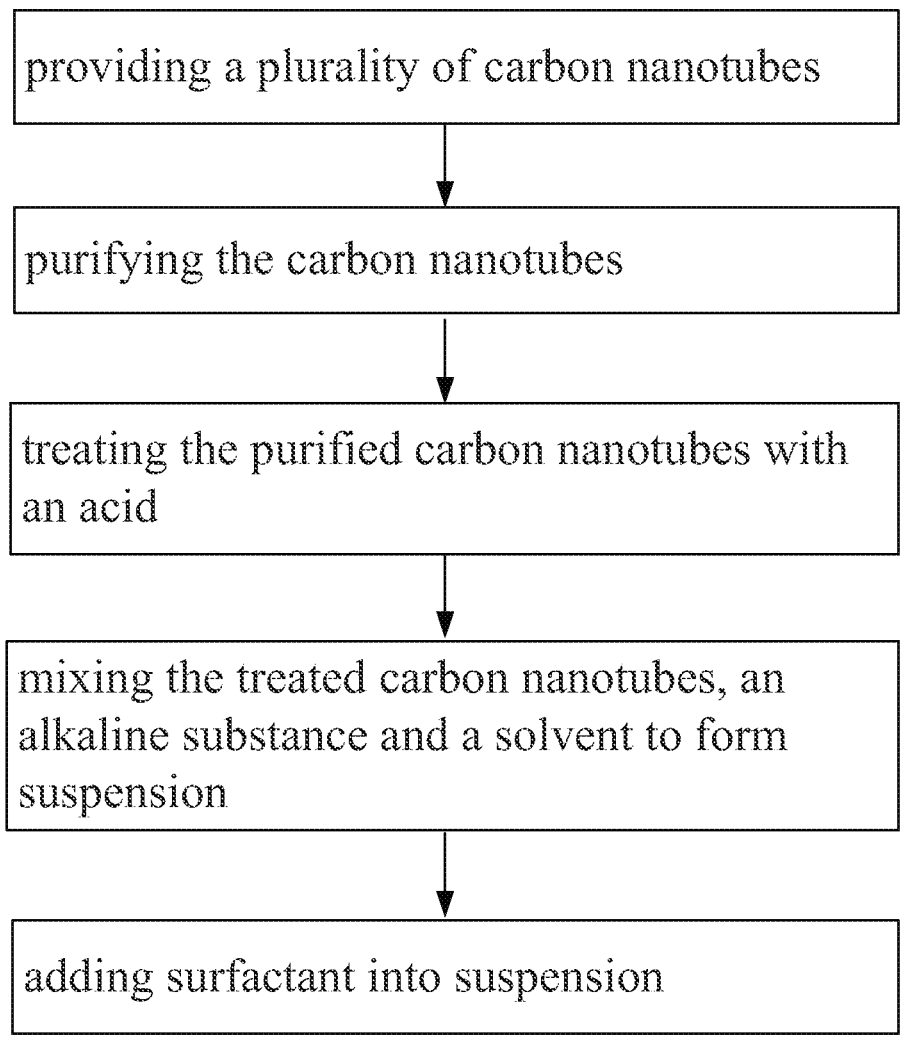
FIG. 1 is a flow process chart, showing a method for preparing a pre-plating solution, according to one embodiment.

Referring to FIG. 1, a method for preparing the above pre-plating solution includes the steps of:
(1) providing and purifying CNTs;
(2) treating CNTs with an acid;
(3) mixing treated CNTs, an alkaline substance and a solvent to form suspension;
(4) adding surfactant into suspension, and stirring suspension.

In step (1), CNTs can be obtained by a conventional method, such as chemical vapor deposition, arc discharging, or laser ablation. In this embodiment, CNTs are obtained by the substeps of: providing a substrate; forming a CNT array on the substrate by a chemical vapor depositing method; peeling the CNT array off the substrate by a mechanical method, thereby achieving a number of CNTs. The CNT array is a super-aligned array, and CNTs thereof are substantially parallel to each other. Aspect ratio of CNTs is more than 1000:1, which aids in forming a conductive network among the CNT's.

CNTs are purified by the substeps of: heating in air at about 350° C. for 2 hours to remove amorphous carbons; soaking in about 36% hydrochloric acid for approximately a day to remove metal catalysts; separating, rinsing with de-ionized water, and filtrating.

In step (2), CNTs are treated by the substeps of: refluxing in nitric acid at about 130° C. for 4-48 hours; centrifuging the suspension, rinsing with water until the PH of the used water is 7. In the process, the acid treatment chemically modifies the CNT's with functional groups such as —COOH, —COO and —OH on the walls and end portions thereof. These functional groups help CNTs soluble and dispersible in the solvent. The surfaces of functionalized CNTs include negative surface charges.

In step (3), the treated CNTs, the alkaline substance and the solvent are mixed in a predetermined ratio. In this embodiment, the solvent is de-ionized water, a PH value of the suspension is in an approximate range of 8-11, and CNTs are less than 3 wt % thereof.

In step (4), after adding the surfactant, the suspension is stirred at room temperature for 20-50 minutes by any suitable blending techniques, such as, ultrasonic technique and mechanical stirring technique. The surfactant is used to coat or wet the CNTs, and then the suspension is transformed into a solution.

After step (3), an addition agent (e.g., Polyvinyl Alcohol, Polyvinyl Pyrrolidone) can be added into the pre-plating solution to improve the viscosity thereof. The pre-plating solution with a higher viscosity is feasible for coating on the PCB.

Figure 2:
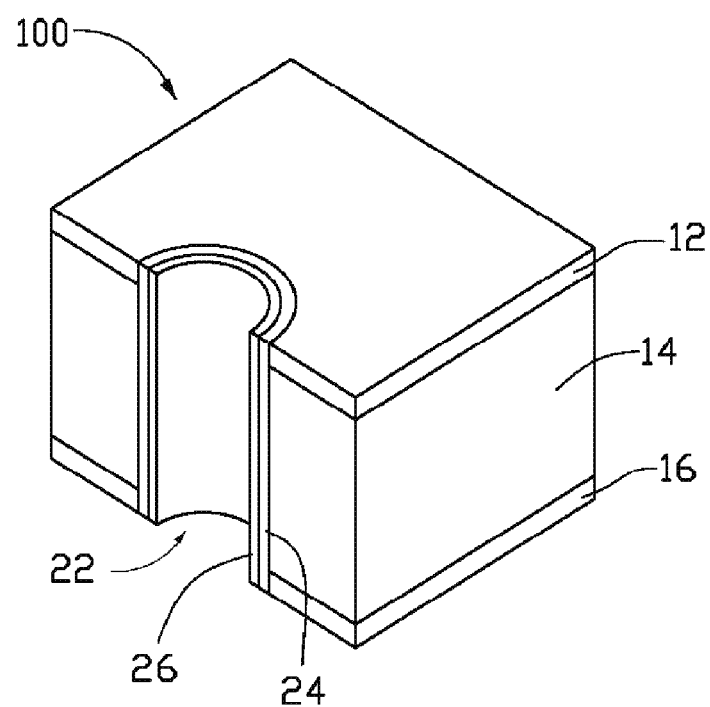
FIG. 2 is a schematic, perspective view of a printed circuit board, according to one embodiment.

A method for plating PCBs with the pre-plating solution includes the following steps:

Step 1: referring to FIGS. 1 and 2, a PCB 100 is provided. The PCB 100 includes a base material 14 covered with a first and a second Cu foil 12 and 16 on a first and a second surface thereof respectively. At least one through-hole 22 is defined in the PCB 100, and runs from the first to the second surface. The through-hole 22 has an inner circumferential surface and is formed by an etching method or a drilling method.

Step 2: the inner circumferential surface of the through-hole 22 is cleaned and the surface charges thereon are discharged.

Step 3: the PCB 100 is soaked in the pre-plating solution at 15-40° C. for 1-10 minutes. Then, the treated CNTs of the pre-plating solutions are attached to the inner circumferential surface of the through-hole 22, due to electrostatic attractive force.

Step 4: the PCB 100 is dried. After the solvent is removed, CNTs are deposited on the inner circumferential surface of the through-hole 22 to form a conductive material layer 24. In the conductive material layer 24, CNTs are in contact with one another due to the negative surface charges and form a number of conductive paths. Due to a high aspect ratio and good conductive property, less CNTs are needed to form a substantially continuous conductive material layer 24, when compared with the conventional carbon black material. Therefore, the conductive material layer 24 is thinner, which are applicable for narrower and deeper through-holes. After that, CNTs on undesired portions are removed.

Step 5: a metal layer 26 is plated onto the conductive material layer 24. That is, the PCB 100 is immersed into a suitable electroplating bath for applying a metal coating on the inner circumferential surfaces of the through-holes 22.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

It is also to be understood that the description and the claims may include some indication in reference to certain steps. However, the indication used is applied for identification purposes only, and the identification should not be viewed as a suggestion as to the order of the steps.

What is claimed is:

1. A pre-plating solution for making a printed circuit board, wherein the pre-plating solution consists of: a plurality of carbon nanotubes of 0.01-3 wt % with at least one hydrophilic group located on walls or end portions of one or more of the plurality of carbon nanotubes, a surfactant of 0.01-4 wt %, an alkaline substance of 0.01-1 wt % and a solvent.

2. The pre-plating solution as claimed in claim 1, wherein one or more of the carbon nanotubes have a length/diameter ratio of more than 1000:1.

3. The pre-plating solution as claimed in claim 1, wherein the hydrophilic group is selected from the group consisting of —COOH, —COO and —OH.

4. The pre-plating solution as claimed in claim 1, wherein the surfactant is selected from the group consisting of anionic surfactants and nonionic surfactants.

5. The pre-plating solution as claimed in claim 1, wherein the alkaline substance is selected from the group consisting of sodium hydroxide, potassium hydroxide, ammonium hydroxide and potassium carbonate.

6. The pre-plating solution as claimed in claim 1, wherein a PH value of the pre-plating solution is in an approximate range from 8 to 10.

7. The pre-plating solution as claimed in claim 1, wherein the solvent is de-ionized water.

8. The pre-plating solution as claimed in claim 1, wherein the surfactant is selected from the group consisting of sodium lauryl sulfate and isosorbide dinitrate.

9. The pre-plating solution as claimed in claim 1, wherein the plurality of carbon nanotubes is obtained by chemical vapor deposition, arc discharging, or laser ablation.

10. The pre-plating solution as claimed in claim 1, wherein the plurality of carbon nanotubes is obtained by peeling an array of carbon nanotubes off a substrate.

11. The pre-plating solution as claimed in claim 10, wherein the carbon nanotubes of the array are substantially parallel to each other.

* * * * *